United States Patent
Liu et al.

(10) Patent No.: US 9,177,919 B2
(45) Date of Patent: Nov. 3, 2015

(54) CHIP PACKAGE AND METHOD FOR FORMING THE SAME

(71) Applicant: XINTEC INC., Jhongli, Taoyuan County (TW)

(72) Inventors: Chien-Hung Liu, New Taipei (TW); Ying-Nan Wen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/540,460

(22) Filed: Nov. 13, 2014

(65) Prior Publication Data

US 2015/0137341 A1    May 21, 2015

Related U.S. Application Data

(60) Provisional application No. 61/905,470, filed on Nov. 18, 2013.

(51) Int. Cl.
*H01L 23/00* (2006.01)
*H01L 23/538* (2006.01)
*H01L 23/28* (2006.01)

(52) U.S. Cl.
CPC ............ *H01L 23/5386* (2013.01); *H01L 23/28* (2013.01); *H01L 24/03* (2013.01); *H01L 24/06* (2013.01); *H01L 2224/02372* (2013.01); *H01L 2924/1461* (2013.01)

(58) Field of Classification Search
CPC ................. H01L 23/49562; H01L 23/49575; H01L 23/49524; H01L 23/4952; H01L 23/49537; H01L 23/49541; H01L 23/49548
See application file for complete search history.

(56) References Cited

U.S. PATENT DOCUMENTS 7,041,534 B2 * 5/2006 Chao et al. ................ 438/114

* cited by examiner

*Primary Examiner* — Roy Potter
(74) *Attorney, Agent, or Firm* — Liu & Liu

(57) ABSTRACT

A chip package including a first substrate having a first surface and a second surface opposite thereto is provided. The first substrate has a micro-electric element and a plurality of conducting pads adjacent to the first surface. The first substrate has a plurality of openings respectively exposing a portion of each conducting pad. A second substrate is disposed on the first surface. An encapsulation layer is disposed on the first surface and covers the second substrate. A redistribution layer is disposed on the second surface and extends into the openings to electrically connect the conducting pads.

23 Claims, 17 Drawing Sheets

CHIP PACKAGE AND METHOD FOR FORMING THE SAME

CROSS REFERENCE TO RELATED APPLICATIONS

This Application claims the benefit of U.S. Provisional Application No. 61/905,470, filed on Nov. 18, 2013, the entirety of which is incorporated by reference herein.

BACKGROUND OF THE INVENTION

1. Field of the Invention

The invention relates to a chip package and methods for forming the same, and in particular to a chip package formed by a wafer-level packaging process.

2. Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

Manufacturing processes of chip packages comprise dicing a wafer substrate into a plurality of chips. The chip is then disposed on a lead frame, whose size is greater than that of the chip. Next, conducting pads of the chip are electrically connected to bonding pads of the lead frame by gold wires so as to form external electrical connection paths of the chip.

However, using the gold wires and the lead frame as the external electrical connection paths costs a lot and increases the overall size of the chip package. As a result, it is difficult to further decrease the size of the chip package.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a first substrate having a first surface and a second surface opposite thereto. The first substrate has a micro-electric element and a plurality of conducting pads adjacent to the first surface. The first substrate has a plurality of openings respectively exposing a portion of each conducting pad. A second substrate is disposed on the first surface. An encapsulation layer is disposed on the first surface and covers the second substrate. A redistribution layer is disposed on the second surface and extends into the openings to electrically connect the conducting pads.

An embodiment of the invention provides a method for forming a chip package comprising providing a first substrate having a first surface and a second surface opposite thereto, wherein the first substrate has a micro-electric element and a plurality of conducting pads adjacent to the first surface. A second substrate is disposed on the first surface. An encapsulation layer is formed on the first surface to cover the second substrate. A plurality of openings is formed in the first substrate to respectively expose a portion of each conducting pad. A redistribution layer is formed on the second surface, wherein the redistribution layer extends into the openings to electrically connect the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
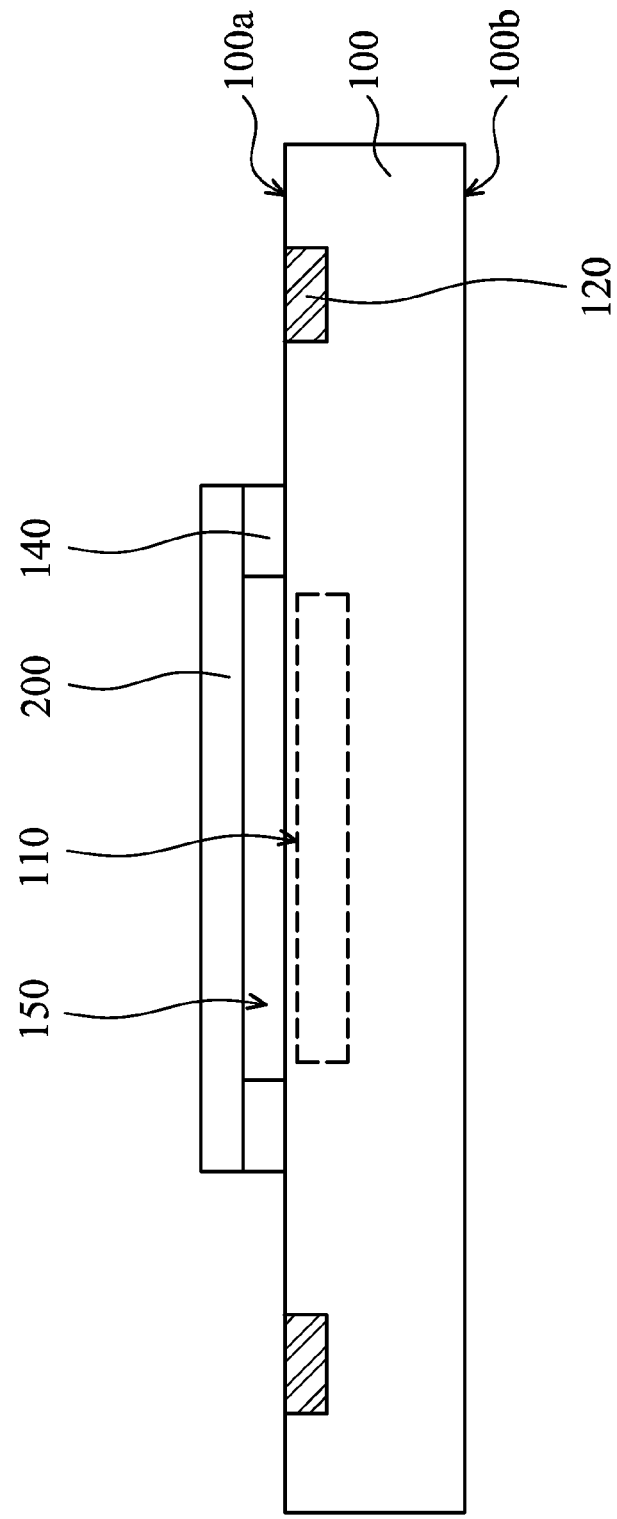
FIGS. 1A to 1F are cross-sectional views of an exemplary embodiment of a method for forming a chip package according to the invention.
Figure 1B:
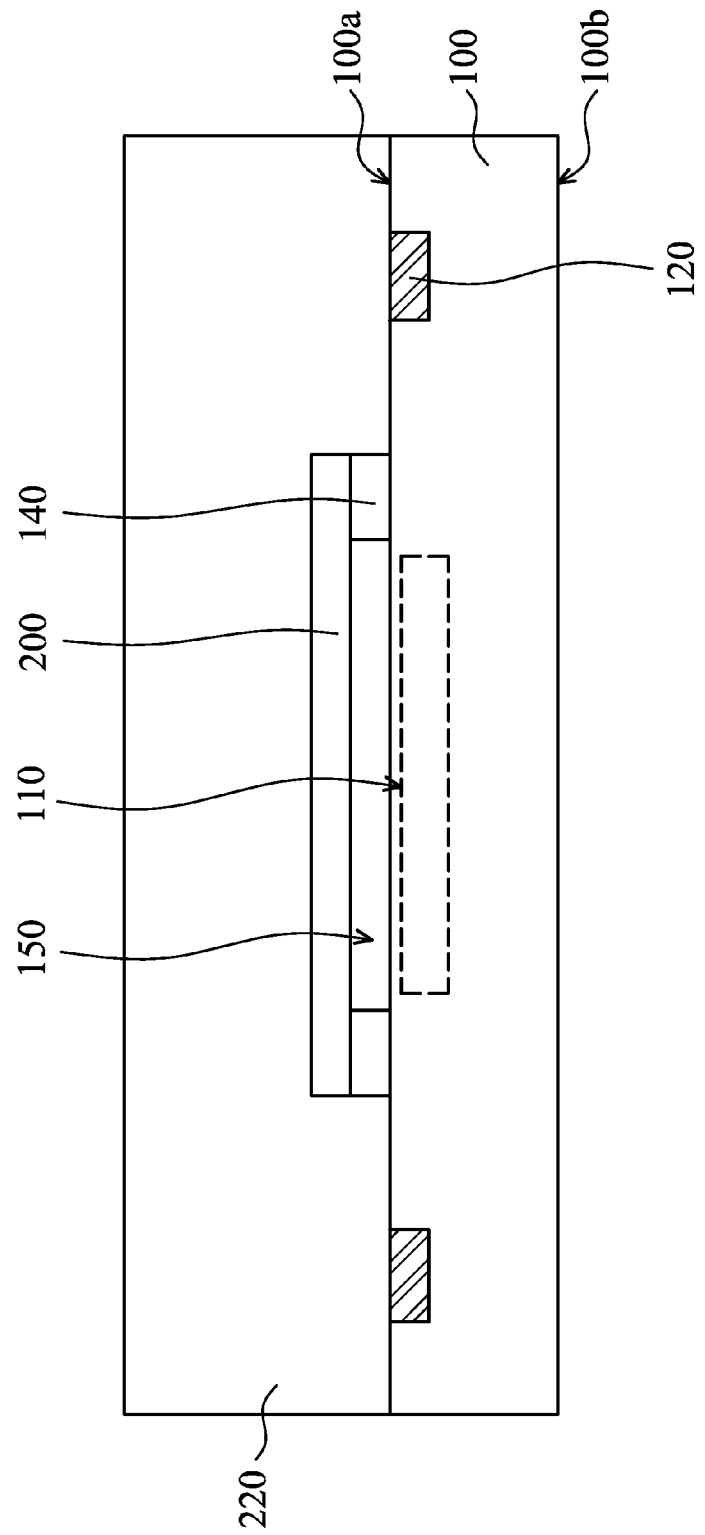
Figure 1C:
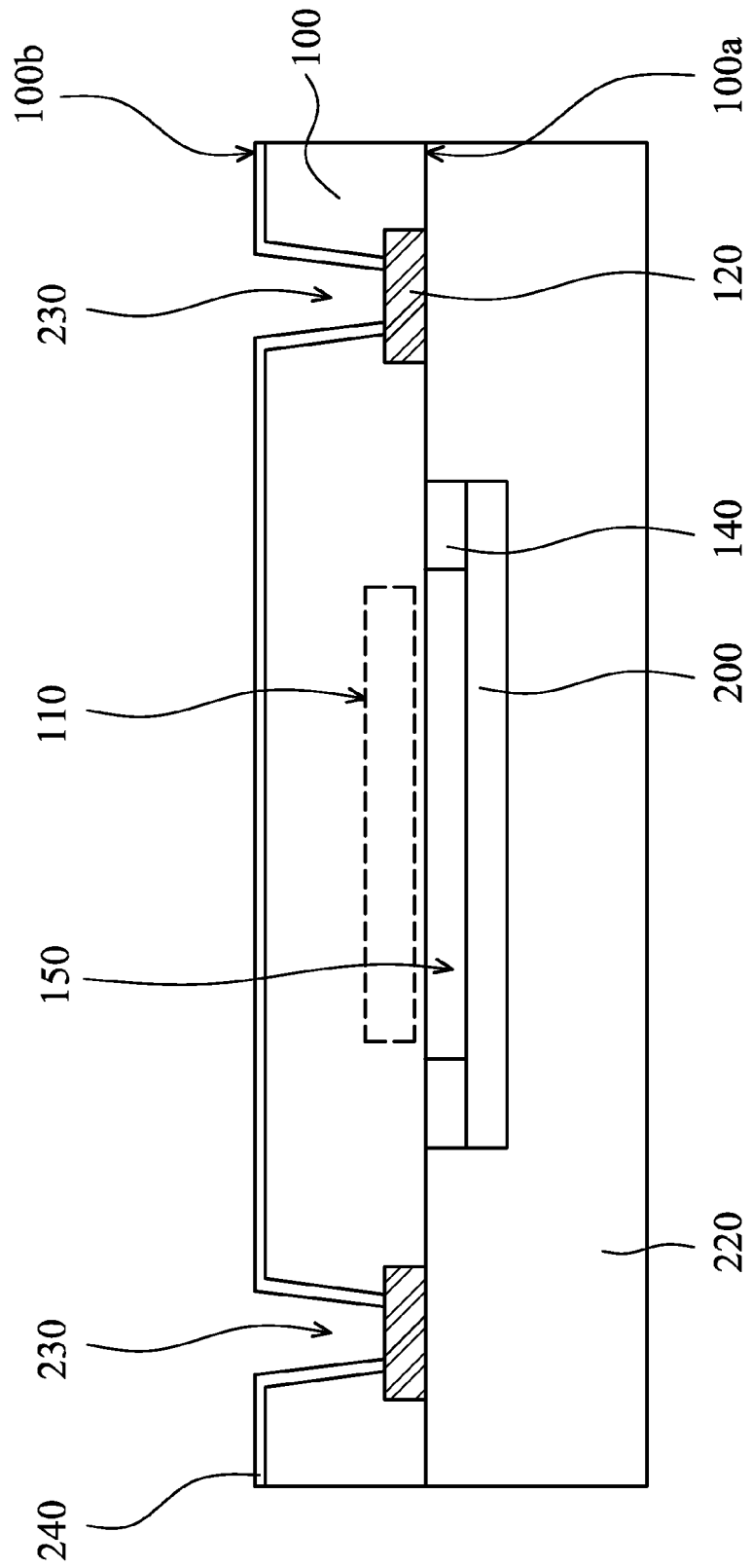
Figure 1D:
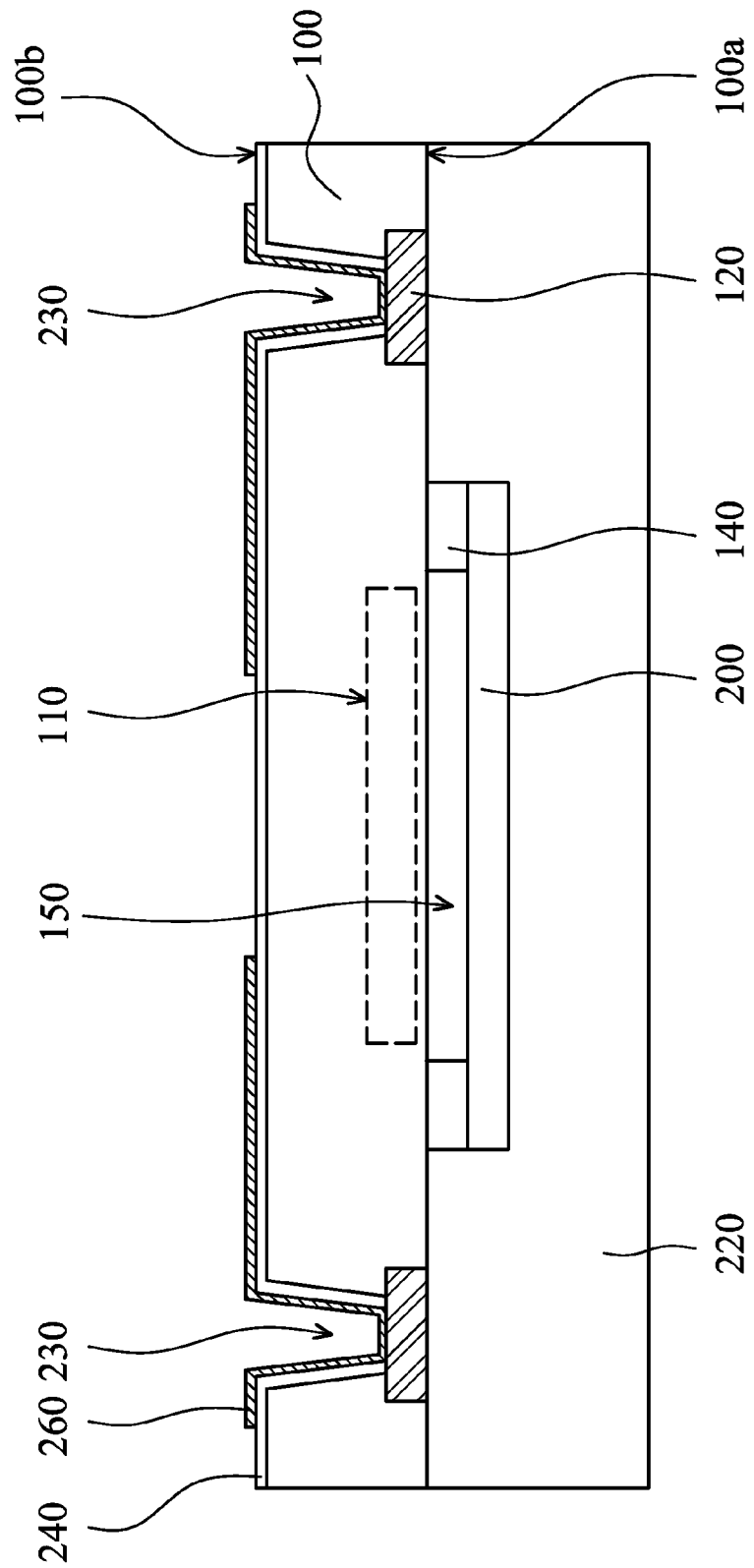
Figure 1E:
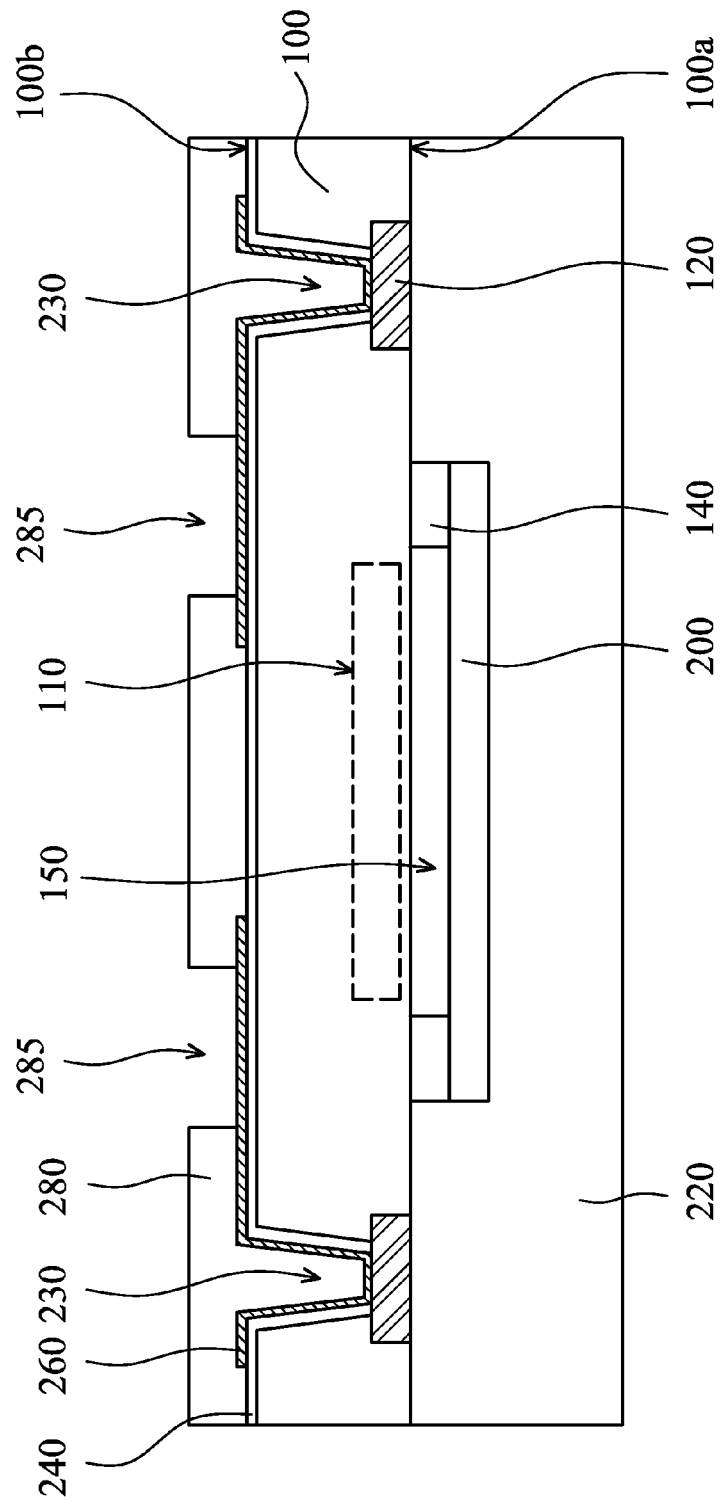
Figure 1F:
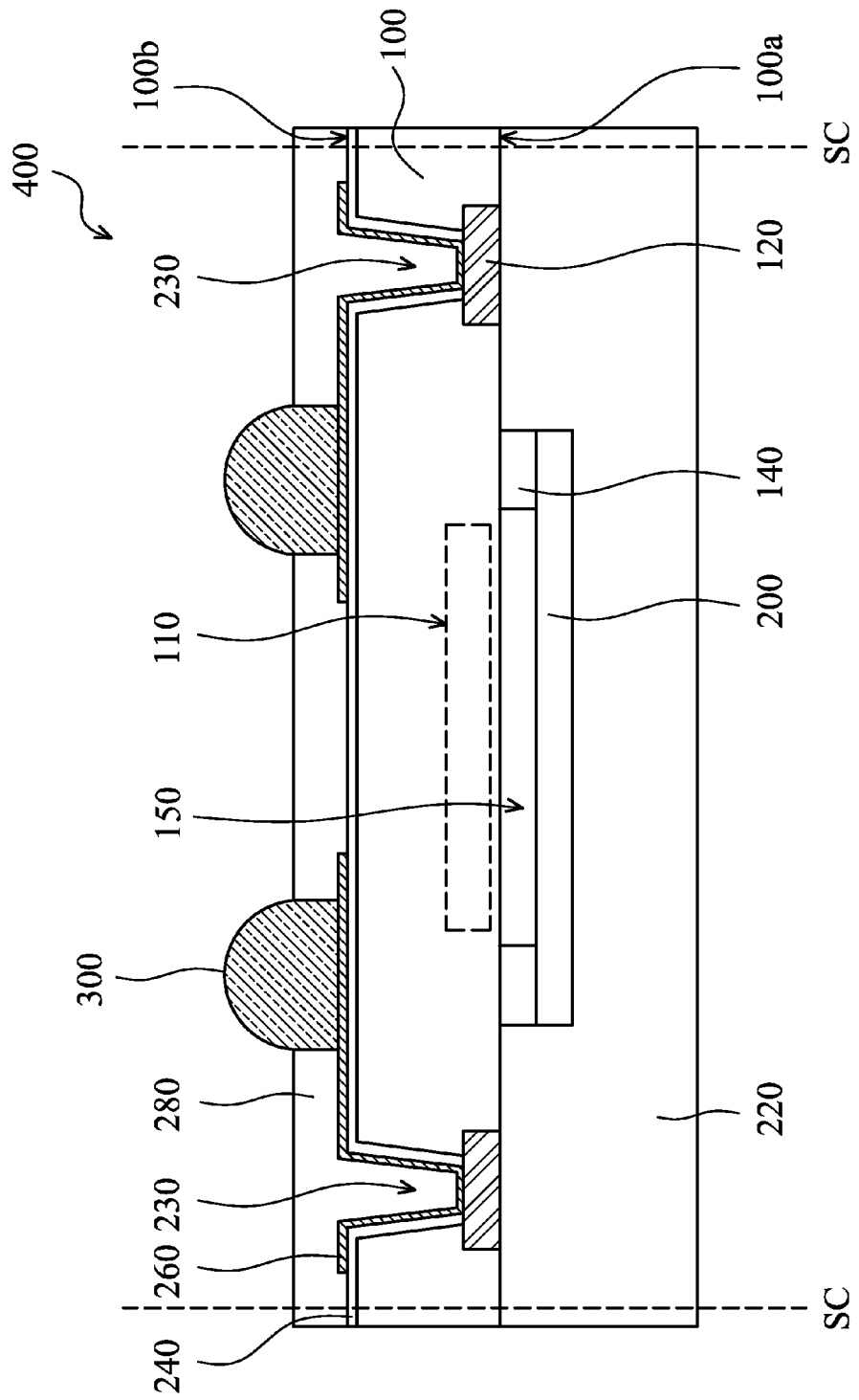

Referring to FIG. 1F, a cross-sectional view of an exemplary embodiment of a chip package 400 according to the invention is illustrated. In the embodiment, the chip package 400 comprises a first substrate 100, a second substrate 200, an encapsulation layer 220 and a redistribution layer 260. The first substrate 100 has a first surface 100a and a second surface 100b opposite thereto, and has at least one micro-electric element disposed in an electronic element region 110. In one embodiment, the first substrate 100 is a silicon wafer so as to facilitate the wafer-level packaging process. In one embodiment, the micro-electric element may comprise a complementary metal-oxide-semiconductor (CMOS) element or a micro electro mechanical system (MEMS) element. In the embodiment, the first substrate 100 has a plurality of conducting pads 120 which may be adjacent to the first surface 100a. The first substrate 100 further has a plurality of openings 230 extending from the second surface 100b toward the first surface 100a and respectively exposing a portion of the surface of each conducting pad 120. In one embodiment, the conducting pad 120 may be a single conducting layer or comprise multiple conducting layers, and be electrically connected to the micro-electric element in the electronic element region 110 by an interconnection structure (not shown).

The second substrate 200 may be disposed on the first surface 100a of the first substrate 100 by a spacer layer (or dam) 140. Namely, the spacer layer 140 is disposed between the first substrate 100 and the second substrate 200. In one embodiment, the second substrate 200 may be a chip with at least one CMOS or MEMS element therein. The spacer layer 140, which is disposed between the first substrate 100 and the second substrate 200, forms a cavity 150 between the first substrate 100 and the second substrate 200. The CMOS or MEMS element of the second substrate 200 may be electrically connected to the micro-electric element in the electronic element region 110 of the first substrate 100 by forming metal pillars (not shown) in the cavity 150. In another embodiment, the second substrate 200 may be a glass cover plate or a silicon cover plate without any active or passive element therein. In the embodiment, the spacer layer 140 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable insulating materials.

The encapsulation layer 220 is disposed on the first surface 100a of the first substrate 100 and covers the second substrate 200 and the conducting pads 120 to protect the chip package. In one embodiment, the encapsulation layer 220 may comprise molding materials, sealing materials or other suitable materials.

An insulating layer 240 is disposed on the second surface 100b of the first substrate 100, extends to sidewalls of the openings 230 in the first substrate 100, and exposes a portion of each conducting pad 120. In one embodiment, the insulating layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

In the embodiment, the redistribution layer 260 is disposed on the second surface 100b of the first substrate 100 and extends to the bottom the opening 230. The redistribution layer 260 is electrically isolated from the first substrate 100 by the insulating layer 240, and directly contacts the exposed conducting pad 120 to electrically connect the respective conducting pad 120. As a result, the redistribution layer 260 in the opening 230 is also referred to as a through silicon via (TSV). In one embodiment, the redistribution layer 260 may comprise copper, aluminum, gold, platinum or another suitable conducting material.

In the embodiment, the chip package 400 further comprises an insulating layer 280 and conducting structures 300 (such as solder balls, bumps or conducting pillars) disposed on the second surface 100b of the first substrate 100. The insulating layer 280 is filled into the openings 230 of the first substrate 100 to cover the redistribution layer 260, and has openings 285 exposing a portion of the redistribution layer 260 on the second surface 100b. In one embodiment, the insulating layer 280 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials. The conducting structures 300 are disposed on the insulating layer 280 and fill the openings 285 of the insulating layer 280 to electrically connect the redistribution layer 260. In one embodiment, the conducting structures 300 may comprise tin, lead, copper, gold, nickel or a combination thereof.

Figure 2:
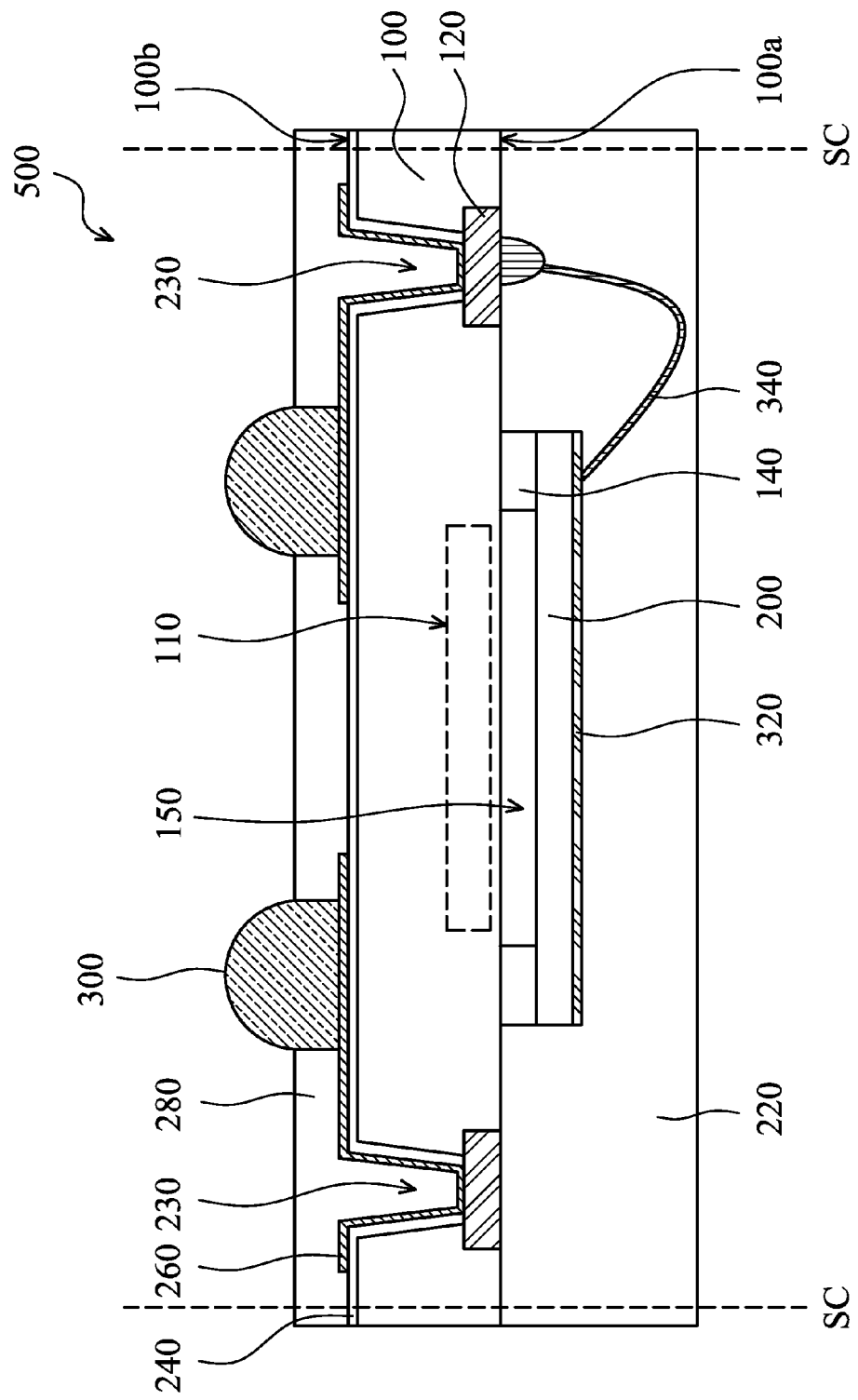
FIG. 2 is a cross-sectional view of another exemplary embodiment of a chip package according to the invention.

Referring to FIG. 2, a cross-sectional view of another exemplary embodiment of a chip package 500 according to the invention is illustrated, wherein elements in FIG. 2 that are the same as those in FIG. 1F are labeled with the same reference numbers as in FIG. 1F and are not described again for brevity. The chip package 500 shown in FIG. 2 has a similar structure to that of the chip package 400 shown in FIG. 1F. The difference therebetween is that the chip package 500 further comprises a metal layer 320 disposed on the second substrate 200 and electrically connected to one of the conducting pads 120 (such as a grounding pad) by at least one wire 340, such that the metal layer 320 is used as a shielding structure for electromagnetic interference (EMI).

Figure 3A:
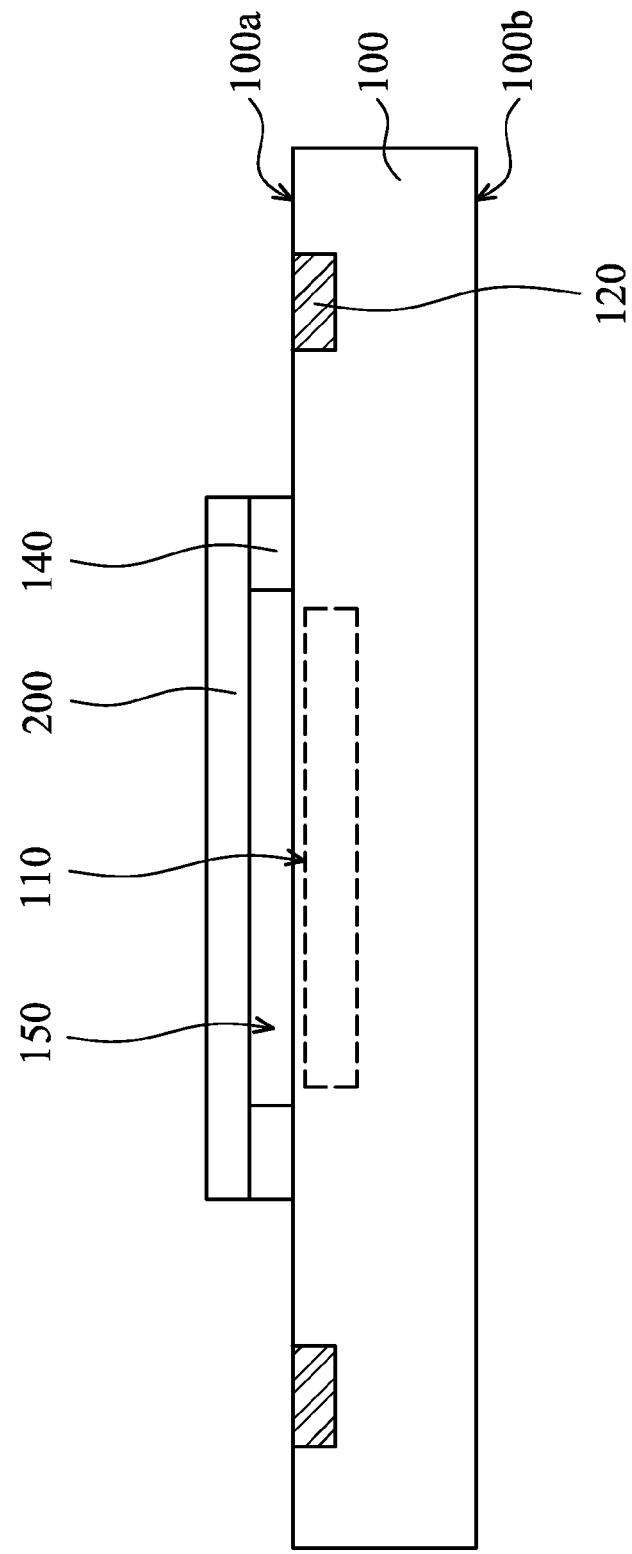
FIGS. 3A to 3D are cross-sectional views of another exemplary embodiment of a method for forming a chip package according to the invention.
Figure 3B:
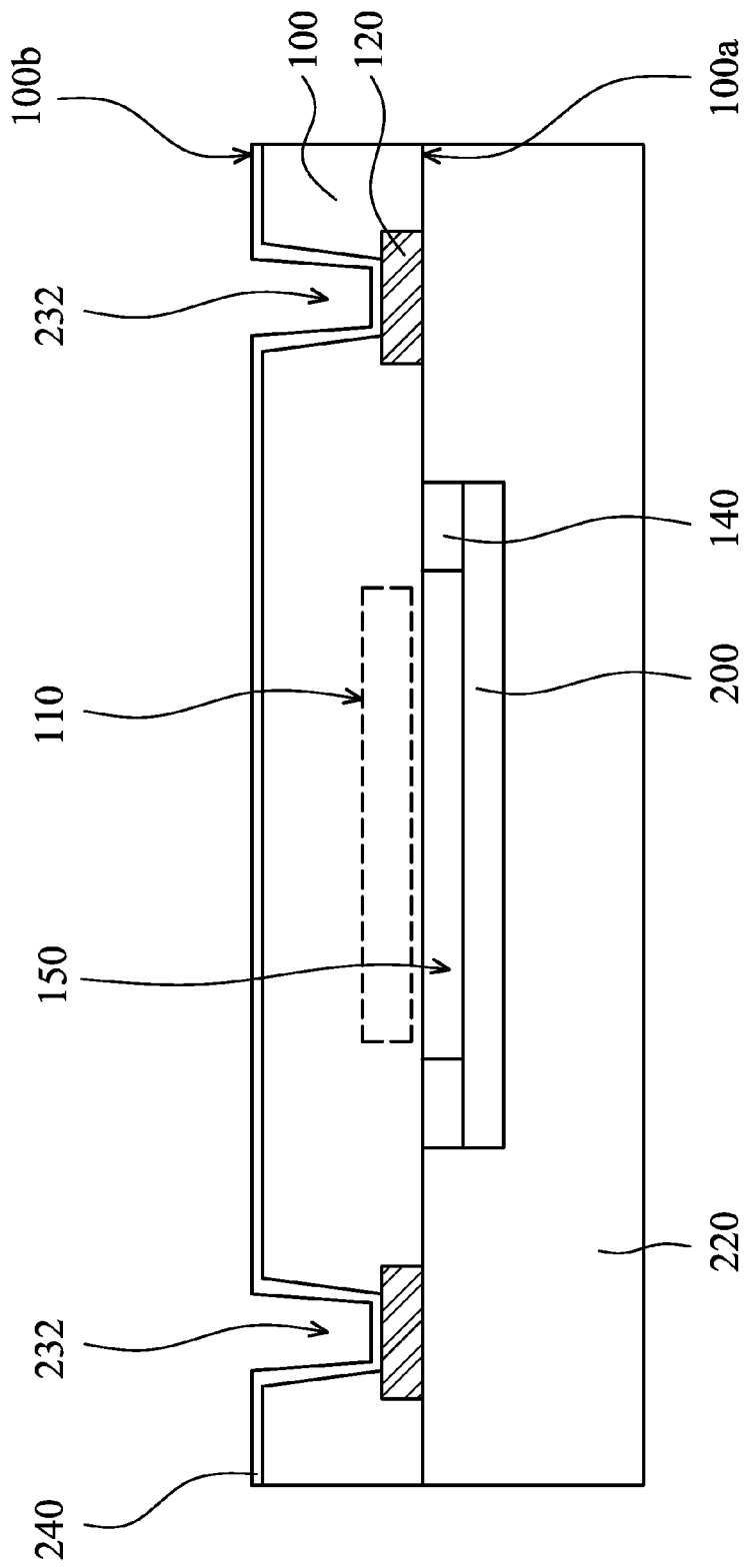
Figure 3C:
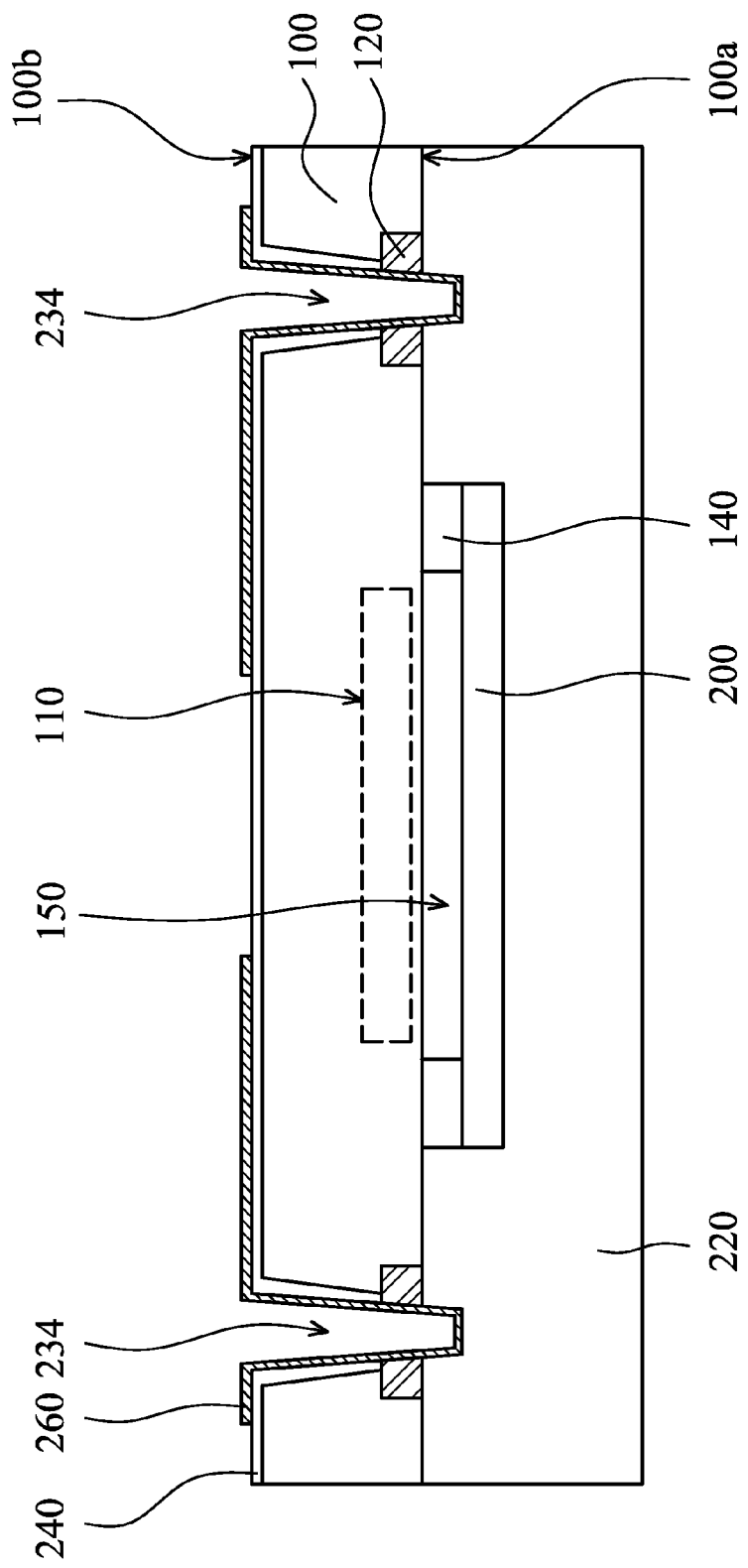
Figure 3D:
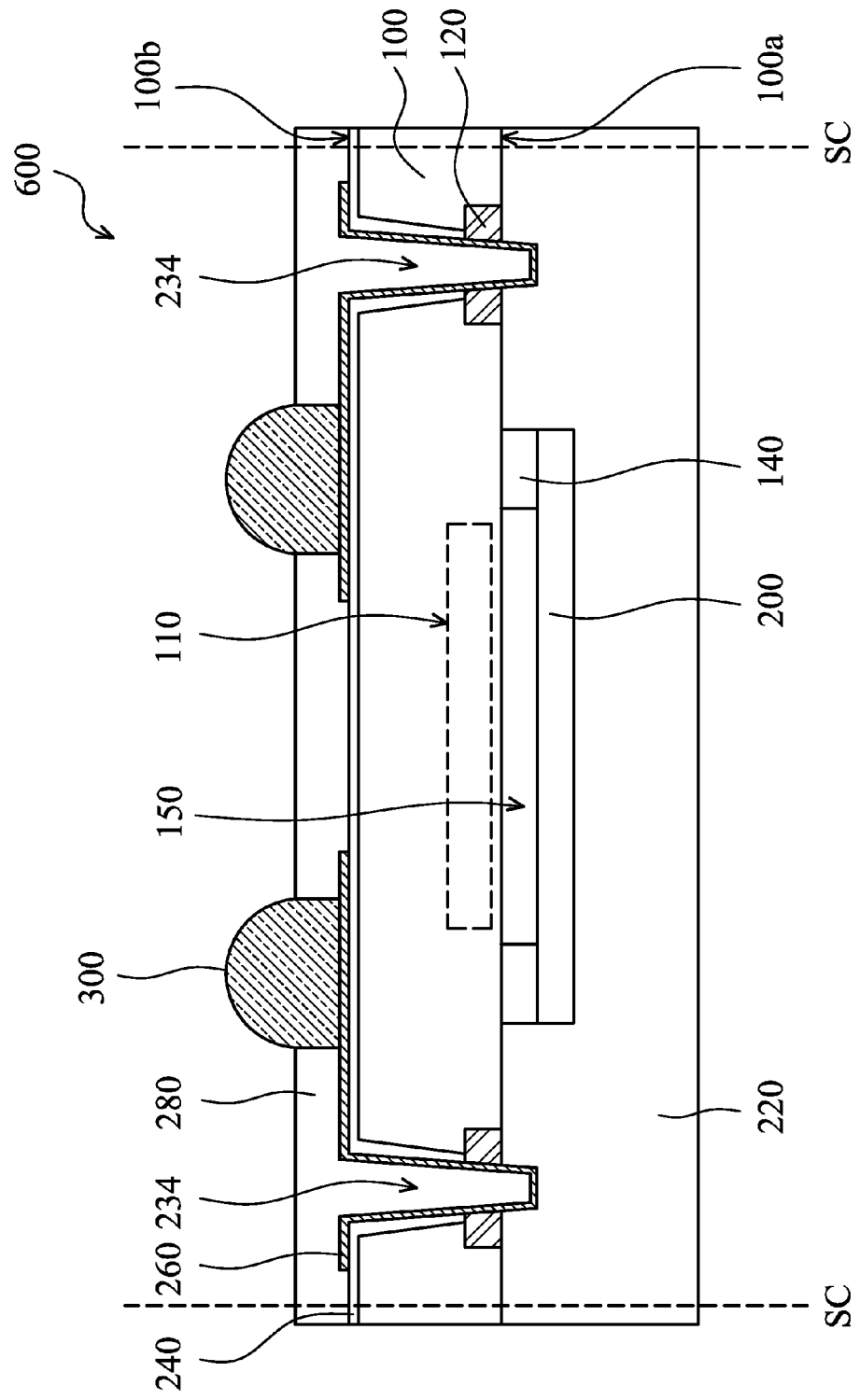

Referring to FIG. 3D, a cross-sectional view of yet another exemplary embodiment of a chip package 600 according to the invention is illustrated, wherein elements in FIG. 3D that are the same as those in FIG. 1F are labeled with the same reference numbers as in FIG. 1F and are not described again for brevity. In the embodiment, the chip package 600 comprises a first substrate 100, a second substrate 200, an encapsulation layer 220 and a redistribution layer 260. Unlike the chip package 400 shown in FIG. 1F, in the embodiment, the first substrate 100 has openings 234 penetrating the conducting pads 120 and extending into the encapsulation layer 220 so as to expose the inside of the conducting pads 120.

In another embodiment, the openings 234 of the first substrate 100 may not extend into the encapsulation layer 220. In the embodiment, the insulating layer 240 is disposed on the second surface 100b of the first substrate 100 and extends to the sidewalls of the openings 234 in the first substrate 100 so as to expose a portion of the encapsulation layer 220.

In the embodiment, the redistribution layer 260 is disposed on the second surface 100b of the first substrate 100 and extends into the opening 234. In one embodiment, the redistribution layer 260 may further extend into the encapsulation layer 220. The redistribution layer 260 is electrically isolated from the first substrate 100 by the insulating layer 240, and comes in direct contact with the inside of the exposed conducting pad 120 to electrically connect the respective conducting pad 120, such that the redistribution layer 260 is also referred to as a ring-contact.

Figure 4:
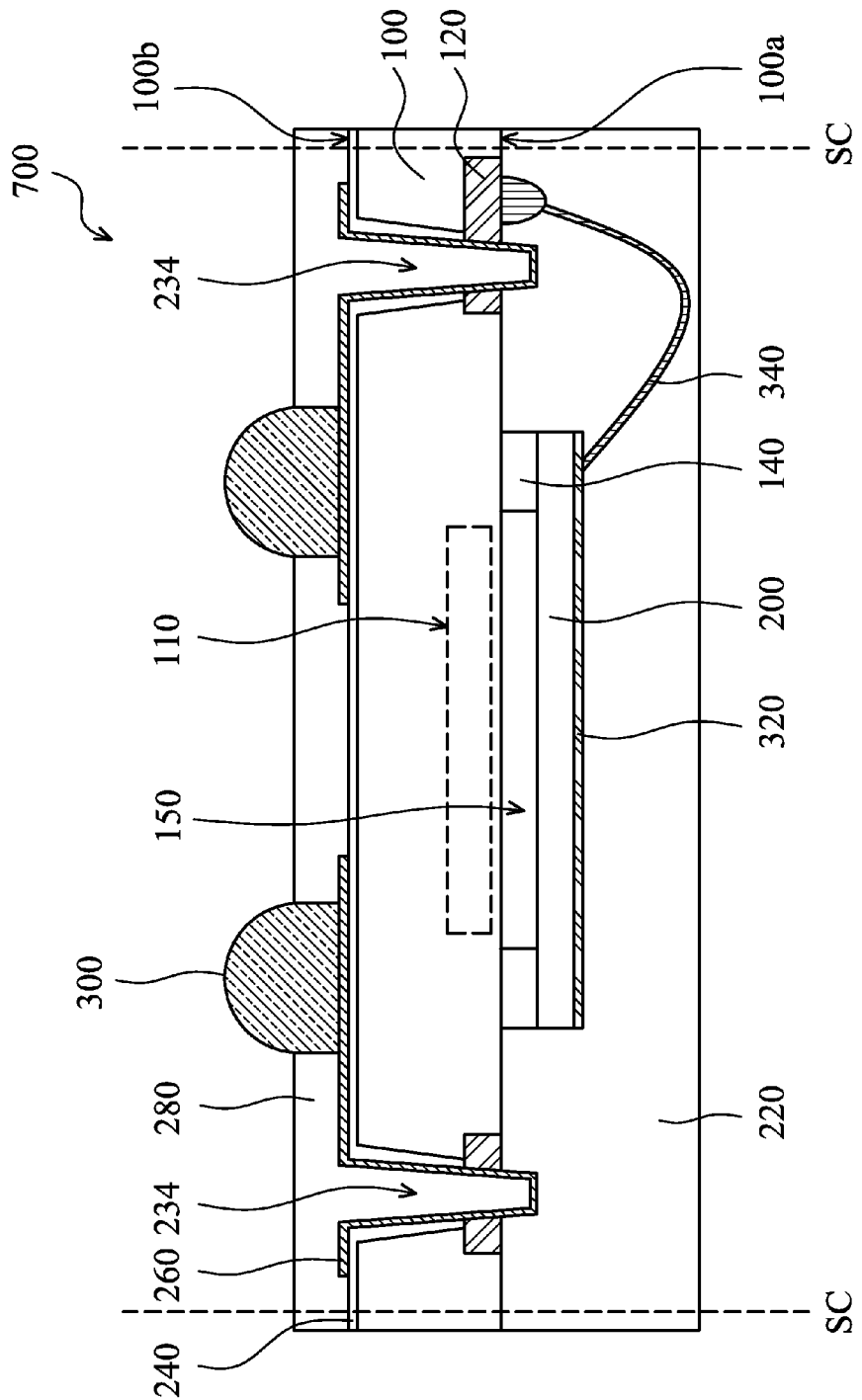
FIG. 4 is a cross-sectional view of another exemplary embodiment of a chip package according to the invention.

A cross-sectional view of yet another exemplary embodiment of a chip package 700 according to the invention is illustrated in FIG. 4, wherein elements in FIG. 4 that are the same as those in FIG. 3D are labeled with the same reference numbers as in FIG. 3D and are not described again for brevity. The chip package 700 shown in FIG. 4 has a similar structure to that of the chip package 600 shown in FIG. 3D. The difference therebetween is that the chip package 700 further comprises a metal layer 320 disposed on the second substrate 200 and electrically connected to one of the conducting pads 120 (such as a grounding pad) by at least one wire 340, such that the metal layer 320 is used as a shielding structure for electromagnetic interference.

Figure 5A:
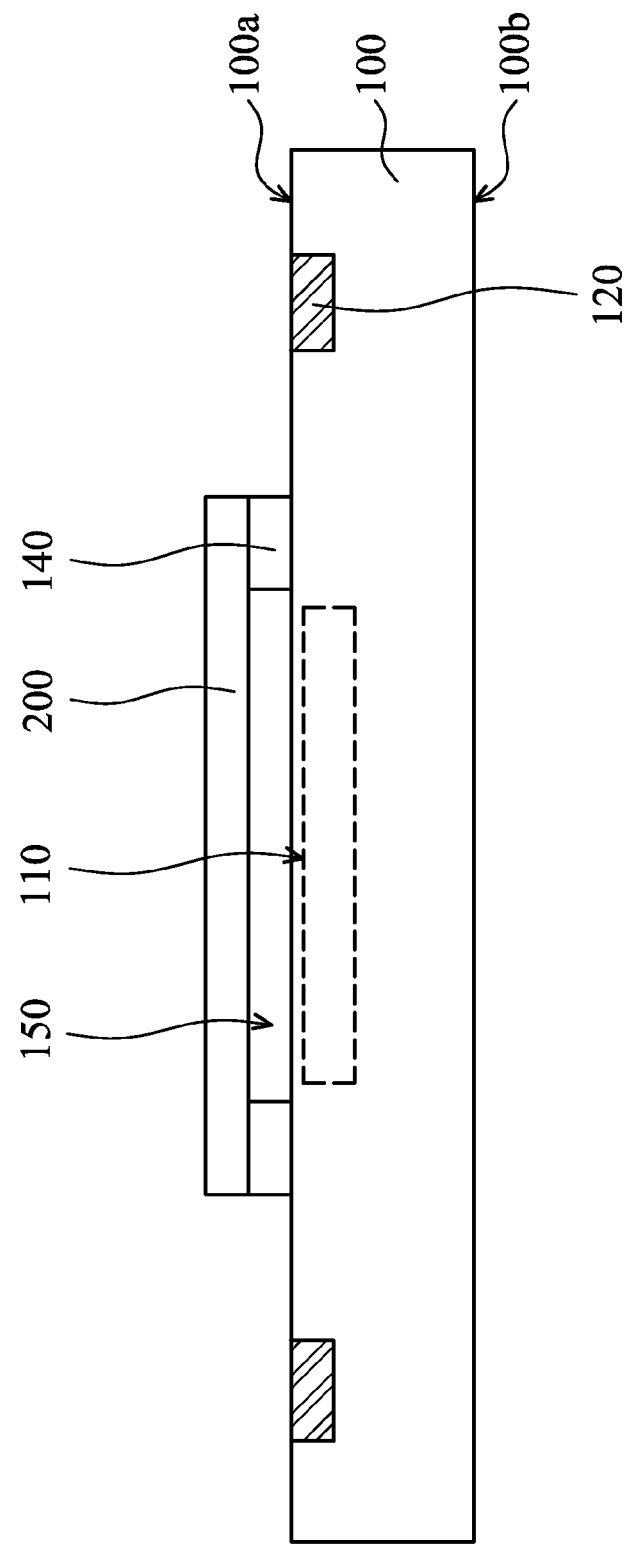
FIGS. 5A to 5D are cross-sectional views of yet another exemplary embodiment of a method for forming a chip package according to the invention.
Figure 5B:
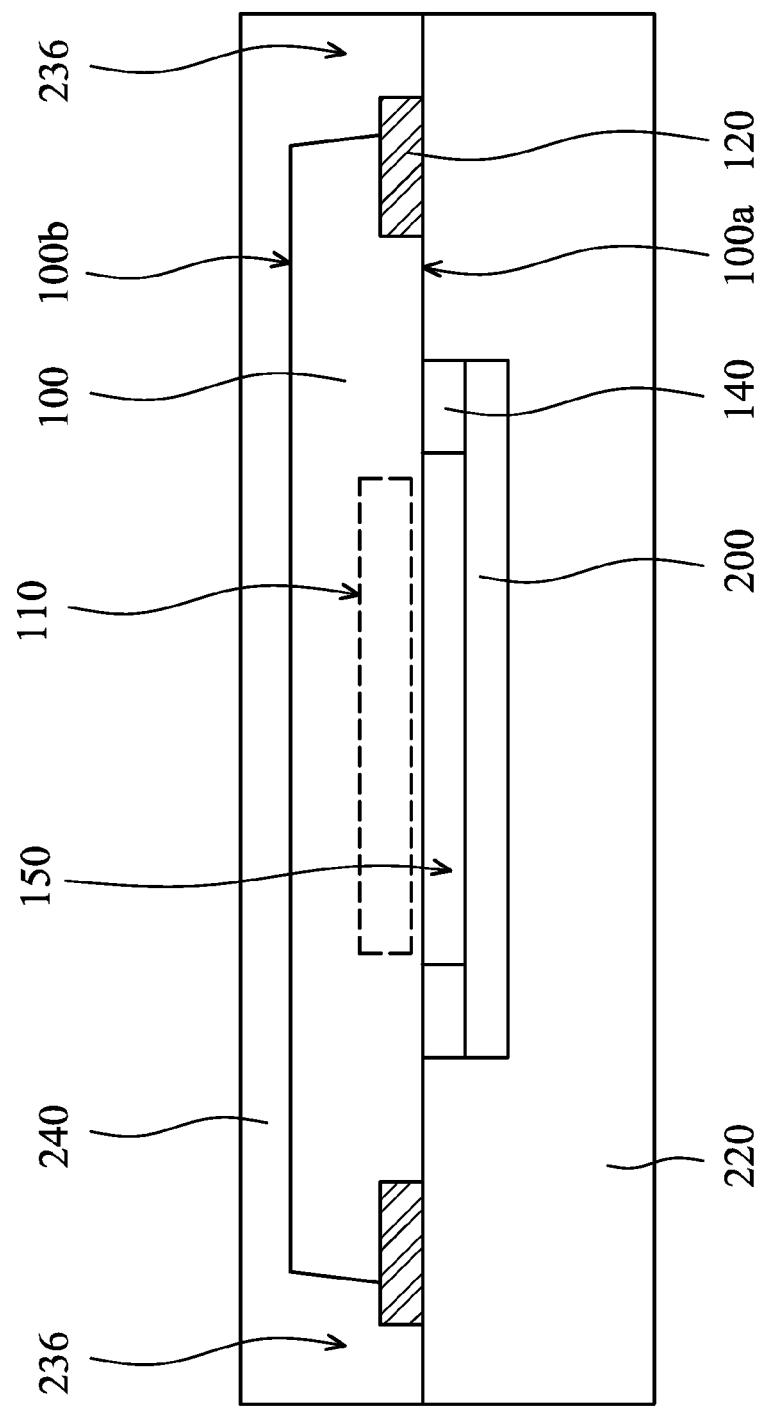
Figure 5C:
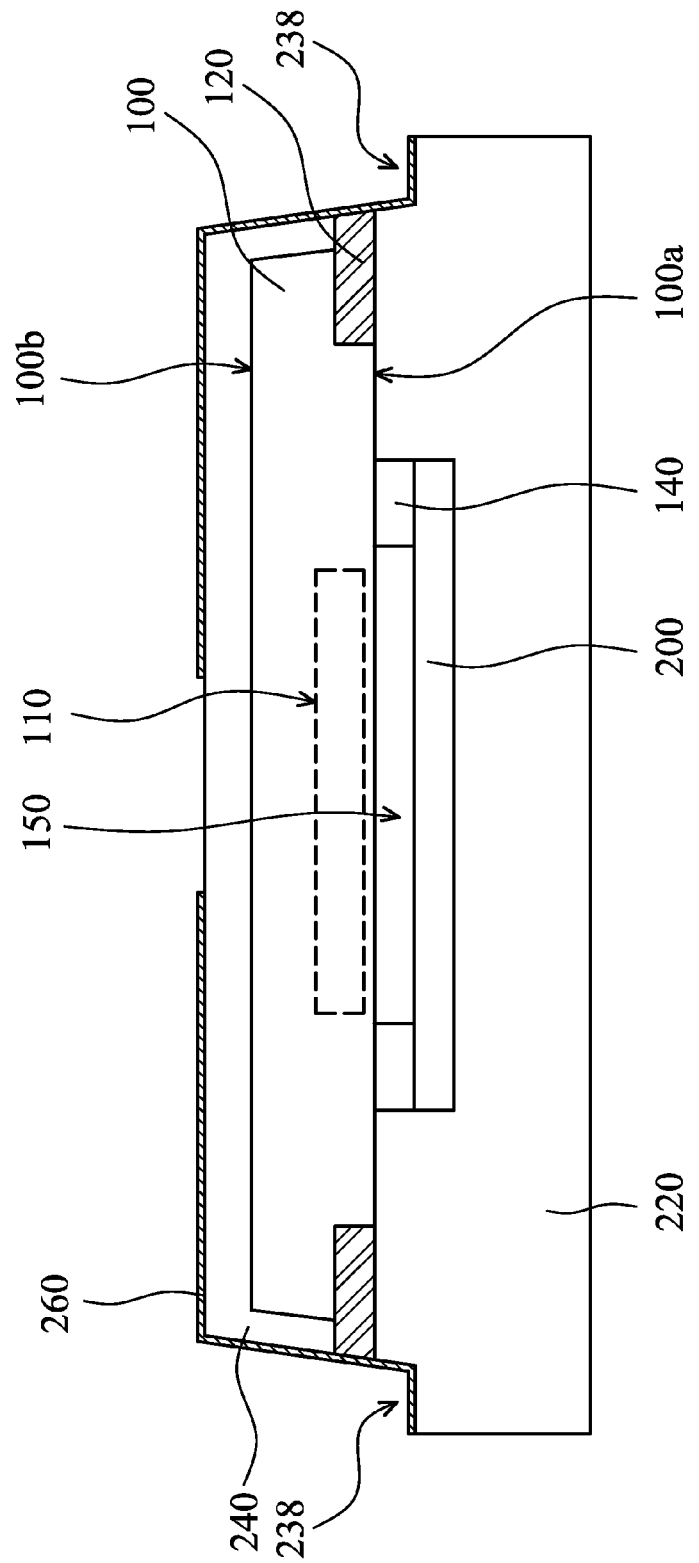
Figure 5D:
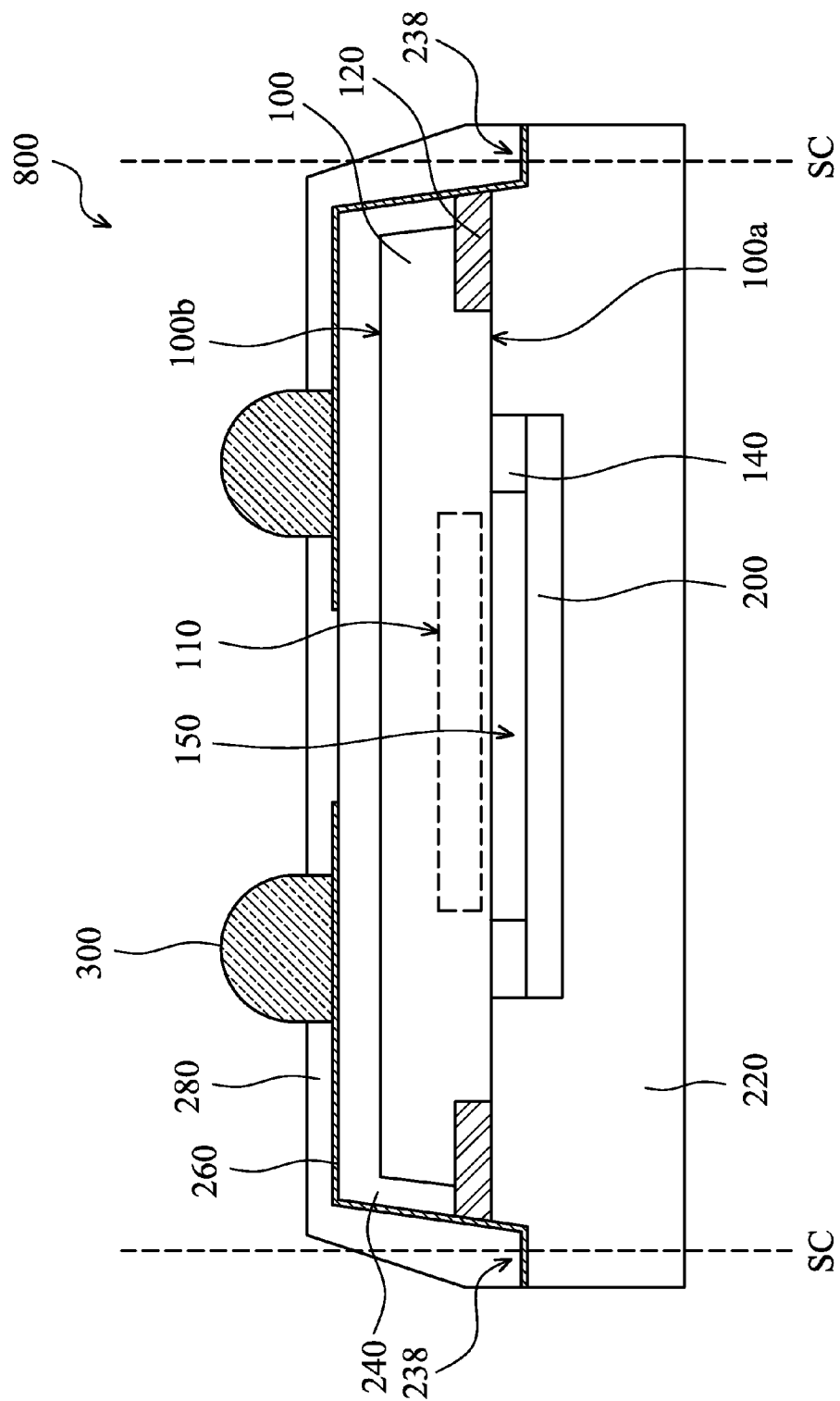

Referring to FIG. 5D, a cross-sectional view of yet another exemplary embodiment of a chip package 800 according to the invention is illustrated, wherein elements in FIG. 5D that are the same as those in FIG. 1F are labeled with the same reference numbers as in FIG. 1F and are not described again for brevity. In the embodiment, the chip package 800 comprises a first substrate 100, a second substrate 200, an encapsulation layer 220 and a redistribution layer 260. In the embodiment, the insulating layer 240 comprises a plurality of openings 238 exposing the sidewalls of the conducting pads 120. In one embodiment, the openings 238 extend into the encapsulation layer 220.

In the embodiment, the redistribution layer 260 is disposed on the second surface 100b of the first substrate 100 and extends into the opening 238 of the insulating layer 240 without penetrating the first substrate 100. The redistribution layer 260 is electrically isolated from the first substrate 100 by the insulating layer 240, and directly contacts the sidewall of the exposed conducting pad 120 to electrically connect the respective conducting pad 120, such that the redistribution layer 260 is also referred to as a T-contact. In one embodiment, the redistribution layer 260 may further extend into the encapsulation layer 220.

Figure 6:
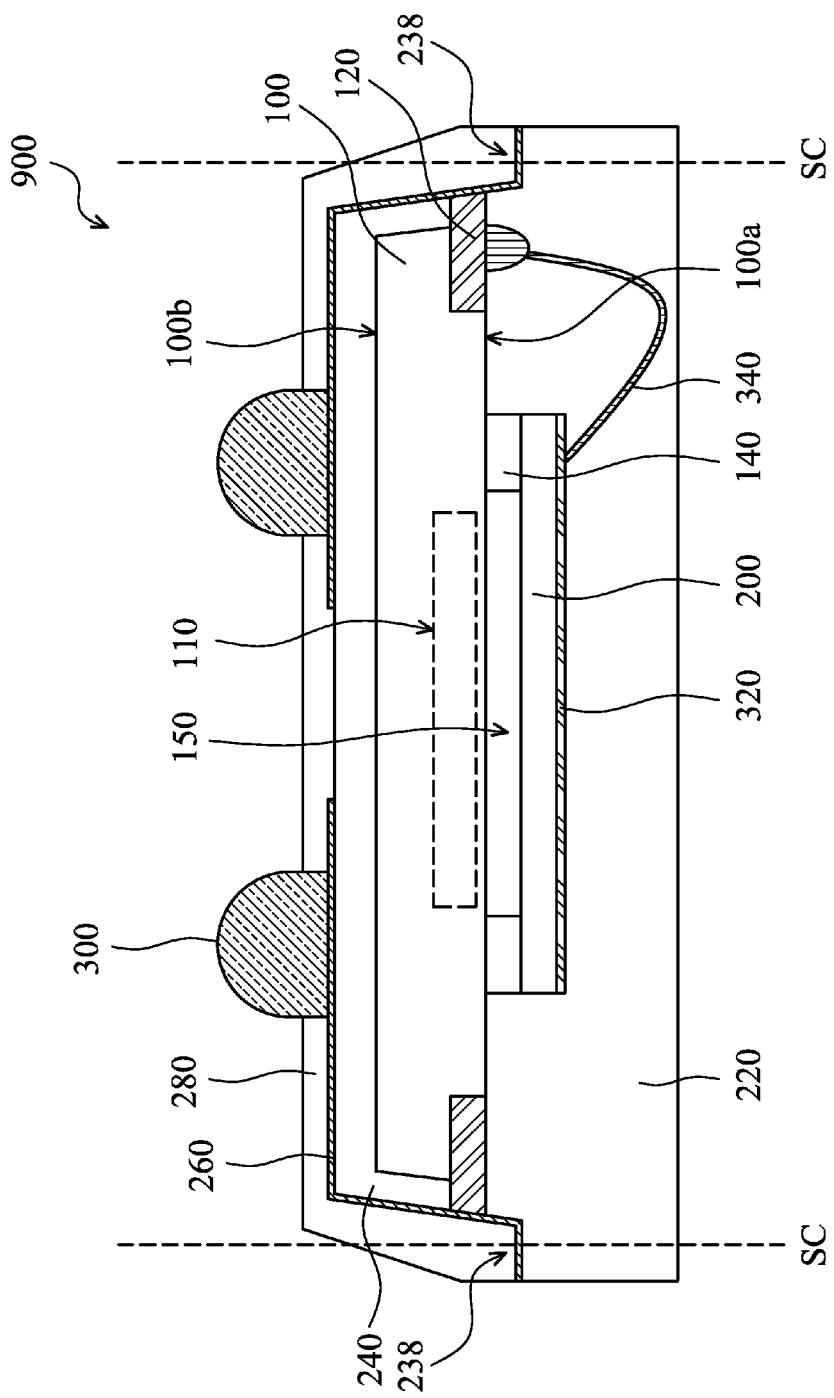
FIG. 6 is a cross-sectional view of yet another exemplary embodiment of a chip package according to the invention.

Referring to FIG. 6, a cross-sectional view of yet another exemplary embodiment of a chip package 900 according to the invention is illustrated, wherein elements in FIG. 6 that are the same as those in FIG. 5D are labeled with the same reference numbers as in FIG. 5D and are not described again for brevity. The chip package 900 shown in FIG. 6 has a similar structure to that of the chip package 800 shown in FIG. 5D. The difference therebetween is that the chip package 900 further comprises a metal layer 320 disposed on the second substrate 200 and electrically connected to one of the conducting pads 120 (such as a grounding pad) by at least one wire 340, such that the metal layer 320 is used as a shielding structure for electromagnetic interference.

According to the aforementioned embodiments, since the through silicon vias, the ring-contacts or the T-contacts, rather than the wires and the lead frame, are used as the external electrical connection paths of the first substrate 100 having the micro-electric element, the processing cost is lowered and the size of the chip package can be reduced further. Moreover, the shielding structure formed on the second substrate 200 can be electrically connected to the conducting pads 120 of the first substrate 100 without being electrically connected to the lead frame. Therefore, the additional shielding structure can shield against EMI without increasing the size of the chip package. In addition, forming chip packages by wafer-level packaging can produce massive chip packages, thereby reducing the processing cost and time.

An exemplary embodiment of a method for forming a chip package according to the invention is illustrated with FIGS. 1A to 1F, in which FIGS. 1A to 1F are cross-sectional views of an exemplary embodiment of a method for forming a chip package 400 according to the invention.

Referring to FIG. 1A, a first substrate 100 having a first surface 100a and a second surface 100b opposite thereto is provided. The first substrate 100 has at least one micro-electric element disposed in an electronic element region 110. In one embodiment, the first substrate 100 is a silicon wafer so as to facilitate the wafer-level packaging process. In one embodiment, the micro-electric element may comprise a CMOS or MEMS element. In the embodiment, the first substrate 100 has a plurality of conducting pads 120 which may be adjacent to the first surface 100a. In one embodiment, the conducting pad 120 may be a single conducting layer or comprise multiple conducting layers, and be electrically connected to the micro-electric element in the electronic element region 110 by an interconnection structure (not shown).

Next, a spacer layer 140 may be formed on the first upper surface 100a of the first substrate 100 by a deposition process (such as a coating process, a physical vapor deposition process, a chemical vapor deposition process or another suitable process). A second substrate 200 is then provided on the spacer layer 140 so as to form a cavity 150 between the first substrate 100 and the second substrate 200. In the embodiment, the spacer layer 140 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials. In one embodiment, the second substrate 200 may be a chip with at least one CMOS or MEMS element therein. The CMOS or MEMS element of the second substrate 200 may be electrically connected to the micro-electric element in the electronic element region 110 of the first substrate 100 by forming metal pillars (not shown) in the cavity 150. In another embodiment, the second substrate 200 may be a glass cover plate or a silicon cover plate without any active or passive element therein.

Referring to FIG. 1B, an encapsulation layer 220 may be formed on the first surface 100a of the first substrate 100 by a molding process, a printing process or another suitable process to cover the second substrate 200 and the conducting pads 120. In one embodiment, the encapsulation layer 220 may comprise molding materials, sealing materials or other suitable materials.

Referring to FIG. 1C, a plurality of openings 230 may be formed in the first substrate 100 by lithography and etching processes (the etching process may comprise a dry etching process, a wet etching process, a plasma etching process, a reactive ion etching process or another suitable process) using the encapsulation layer 220 formed on the first surface 100a of the first substrate 100 as a carrier substrate. The openings 230 extend from the second surface 100b toward the first surface 100a and respectively expose a portion of the surface of each conducting pad 120.

Next, an insulating layer 240 may be formed on the second surface 100b of the first substrate 100 by a deposition process (such as a coating process, a physical vapor deposition process, a chemical vapor deposition process or another suitable process), and extend into the openings 230 of the first substrate 100. Next, the insulating layer 240 on the bottom of the openings 230 may be removed by lithography and etching processes to expose the conducting pads 120. In one embodiment, the insulating layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

Referring to FIG. 1D, a patterned redistribution layer 260 may be formed on the second surface 100b by a deposition process (such as a coating process, a chemical vapor deposition process, a physical vapor deposition process, an electroplating process, an electroless plating process or another suitable process) and lithography and etching processes. The redistribution layer 260 extends to the bottom of the opening 230 in the first substrate 100. The redistribution layer 260 is electrically isolated from the first substrate 100 by the insulating layer 240, and directly contacts the exposed conducting pad 120 to electrically connect the respective conducting pad 120. In one embodiment, the redistribution layer 260 may comprise copper, aluminum, gold, platinum or another suitable conducting material.

Referring to FIG. 1E, an insulating layer 280 may be formed on the second surface 100b of the first substrate 100 by a deposition process, and filled into the openings 230 of the first substrate 100 to cover the redistribution layer 260. Next, openings 285 may be formed in the insulating layer 280 by lithography and etching processes to expose a portion of the redistribution layer 260 on the second surface 100b. In one embodiment, the insulating layer 280 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials.

Referring to FIG. 1F, conducting structures 300 (such as solder balls, bumps or conducting pillars) are formed on the insulating layer 280 and fill the openings 285 of the insulating layer 280 to electrically connect the patterned redistribution layer 260. For example, solder may be formed in the openings 285 of the insulating layer 280 by a plating process, a screen printing process or another suitable process, and then a reflow process is performed to form the conducting structures 300. In one embodiment, the conducting structures 300 may comprise tin, lead, copper, gold, nickel or a combination thereof. Next, the first substrate 100 and the encapsulation layer 220 are diced along scribe lines SC to form a plurality of independent chip packages 400.

In another embodiment, before the encapsulation layer 220 is formed, a metal layer 320 and at least one wire 340 may be formed on the second substrate 200 by a deposition process and a wire bonding process. The metal layer 320 is electrically connected to one of the conducting pads 120 (such as a grounding pad) by the wire 340, such that the metal layer 320 is used as a shielding structure for electromagnetic interference. Next, the encapsulation layer 220, the insulating layer 240, the redistribution layer 260, the insulating layer 280 and the conducting structures 300 may be sequentially formed by a similar method to the exemplary embodiment of a method for forming a chip package as shown in FIGS. 1B to 1F so as to complete the fabrication of the chip package 500, as shown in FIG. 2.

Another exemplary embodiment of a method for forming a chip package according to the invention is illustrated with FIGS. 3A to 3D, in which FIGS. 3A to 3D are cross-sectional views of another exemplary embodiment of a method for forming a chip package 600 according to the invention. Elements in FIGS. 3A to 3D that are the same as those in FIGS. 1A to 1F are labeled with the same reference numbers as in FIGS. 1A to 1F and are not described again for brevity.

Referring to FIG. 3A, the same structure shown in FIG. 1A is provided. Next, referring to FIG. 3B, an encapsulation layer 220 may be formed on the first surface 100a of the first substrate 100 by a molding process, a printing process or another suitable process to cover the second substrate 200 and the conducting pads 120. A plurality of openings 232 is then formed in the first substrate 100 by lithography and etching processes using the encapsulation layer 220 formed on the first surface 100a of the first substrate 100 as a carrier substrate. The openings 232 extend from the second surface 100b toward the first surface 100a and respectively expose a portion of the surface of each conducting pad 120. Next, an insulating layer 240 may be formed on the second surface 100b of the first substrate 100 by a deposition process, and extend into the openings 232 of the first substrate 100.

Referring to FIG. 3C, the openings 232 may be extended from the first substrate 100 into the encapsulation layer 220 to form a plurality of openings 234 by a laser drilling process, an etching process (such as a dry etching process, a wet etching process, a plasma etching process or a reactive ion etching process) or another suitable process. The openings 234 extend from the second surface 100b toward the first surface 100a and respectively expose a portion of each conducting pad 120. For example, the openings 234 penetrate the insulating layer 240 and the conducting pads 120 under the bottom of the openings 232 so as to extend into the encapsulation layer 220 and expose the inside of the conducting pads 120. In another embodiment, the openings 234 may extend to the surface of the encapsulation layer 220 without extending into the encapsulation layer 220.

Next, a patterned redistribution layer 260 may be formed on the second surface 100b of the first substrate 100 by a deposition process and lithography and etching processes. The redistribution layer 260 extends from the openings 234 into the encapsulation layer 220. In the embodiment, the redistribution layer 260 is electrically isolated from the first substrate 100 by the insulating layer 240, and directly contacts the inside of the exposed conducting pad 120 to electrically connect the respective conducting pad 120, such that the redistribution layer 260 is also referred to as a ring-contact. In another embodiment, when the openings 234 do not extend into the encapsulation layer 220, the redistribution layer 260 may extend onto the surface of the encapsulation layer 220.

Referring to FIG. 3D, an insulating layer 280 and conducting structures 300 may be sequentially formed by the same or similar steps shown in FIGS. 1E to 1F. Next, the first substrate 100 and the encapsulation layer 220 are diced along scribe lines SC to form a plurality of independent chip packages 600.

In another embodiment, before the encapsulation layer 220 is formed, a metal layer 320 and at least one wire 340 may be formed on the second substrate 200 by a deposition process and a wire bonding process. The metal layer 320 is electrically connected to one of the conducting pads 120 (such as a grounding pad) by the wire 340, such that the metal layer 320 is used as a shielding structure for electromagnetic interference. Next, the encapsulation layer 220, the insulating layer 240, the redistribution layer 260, the insulating layer 280 and the conducting structures 300 may be sequentially formed by a similar method to the exemplary embodiment of a method for forming a chip package as shown in FIGS. 3B to 3D so as to complete the fabrication of the chip package 700, as shown in FIG. 4.

Yet another exemplary embodiment of a method for forming a chip package according to the invention is illustrated with FIGS. 5A to 5D, in which FIGS. 5A to 5D are cross-sectional views of another exemplary embodiment of a method for forming a chip package 800 according to the invention. Elements in FIGS. 5A to 5D that are the same as those in FIGS. 1A to 1F are labeled with the same reference numbers as in FIGS. 1A to 1F and are not described again for brevity.

Referring to FIG. 5A, the same structure shown in FIG. 1A is provided. Next, referring to FIG. 5B, an encapsulation layer 220 may be formed on the first surface 100a of the first substrate 100 by a molding process, a printing process or another suitable process to cover the second substrate 200 and the conducting pads 120. A plurality of openings 236 is then formed in the first substrate 100 by lithography and etching processes using the encapsulation layer 220 formed on the first surface 100a of the first substrate 100 as a carrier substrate. The openings 236 extend from the second surface 100b toward the first surface 100a and respectively expose a portion of the sidewall and surface of each conducting pad 120. Next, an insulating layer 240 may be formed on the second surface 100b of the first substrate 100 by a deposition process, and extend into the openings 236 of the first substrate 100.

Referring to FIG. 5C, a plurality of openings 238 may be formed in the insulating layer 240 by a partial dicing/notch process or lithography and etching processes to expose the sidewall of the conducting pads 120. In one embodiment, the openings 238 extend into the encapsulation layer 220. Next, a patterned redistribution layer 260 may be formed on the second surface 100b of the first substrate 100 by a deposition process and lithography and etching processes. The redistribution layer 260 extends from the openings 238 into the encapsulation layer 220. In the embodiment, the redistribution layer 260 is electrically isolated from the first substrate 100 by the insulating layer 240, and directly contacts the inside of the exposed conducting pad 120 to electrically connect to the respective conducting pad 120, such that the redistribution layer 260 is also referred to as a T-contact. In another embodiment, the openings 238 may not extend into the encapsulation layer 220 and the redistribution layer 260 may extend onto the surface of the encapsulation layer 220.

Referring to FIG. 5D, an insulating layer 280 may be formed on the second surface 100b of the first substrate 100 by a deposition process. The insulating layer 280 is filled into the openings 238 of the insulating layer 240 to cover the redistribution layer 260. In one embodiment, the insulating layer 280 fills into the encapsulation layer 220. Next, openings 285 of the insulating layer 280 and conducting structures 300 may be sequentially formed by the same or similar steps shown in FIGS. 1E to 1F. Next, the first substrate 100 and the encapsulation layer 220 are diced along scribe lines SC to form a plurality of independent chip packages 800.

In another embodiment, before the encapsulation layer 220 is formed, a metal layer 320 and at least one wire 340 may be formed on the second substrate 200 by a deposition process and a wire bonding process. The metal layer 320 is electrically connected to one of the conducting pads 120 (such as a grounding pad) by the wire 340, such that the metal layer 320 is used as a shielding structure for electromagnetic interference. Next, the encapsulation layer 220, the insulating layer 240, the redistribution layer 260, the insulating layer 280 and the conducting structures 300 may be sequentially formed by a similar method to the exemplary embodiment of a method for forming a chip package as shown in FIGS. 5B to 5D so as to complete the fabrication of the chip package 900, as shown in FIG. 6.

According to the aforementioned embodiments, using the through silicon vias, the ring-contacts or the T-contacts as the external electrical connection paths of the chip package can significantly reduce the size of the chip package and the processing cost and time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first substrate having a first surface and a second surface opposite thereto, wherein the first substrate has a micro-electric element and a plurality of conducting pads adjacent to the first surface, and wherein the first substrate has a plurality of openings respectively exposing a portion of each of the plurality of conducting pads;
   a second substrate disposed on the first surface;
   an encapsulation layer disposed on the first surface and covering the second substrate; and
   a redistribution layer disposed on the second surface and extending into the plurality of openings to electrically connect the plurality of conducting pads.

2. The chip package as claimed in claim 1, further comprising:
   a metal layer disposed on the second substrate; and
   a wire electrically connecting the metal layer to one of the plurality of conducting pads.

3. The chip package as claimed in claim 1, wherein the plurality of openings further extends to penetrate the plurality of conducting pads.

4. The chip package as claimed in claim 1, wherein the plurality of openings further extends into the encapsulation layer.

5. The chip package as claimed in claim 3, further comprising:
   a metal layer disposed on the second substrate; and
   a wire electrically connecting the metal layer to one of the plurality of conducting pads.

6. The chip package as claimed in claim 1, wherein the plurality of openings respectively exposes a sidewall of each of the plurality of conducting pads.

7. The chip package as claimed in claim 6, wherein the redistribution layer further extends into the encapsulation layer.

8. The chip package as claimed in claim 6, further comprising:
   a metal layer disposed on the second substrate; and
   a wire electrically connecting the metal layer to one of the plurality of conducting pads.

9. The chip package as claimed in claim 1, wherein the micro-electric element comprises a CMOS element or a MEMS element.

10. The chip package as claimed in claim 1, wherein the second substrate has a CMOS element or a MEMS element.

11. The chip package as claimed in claim 1, wherein the second substrate comprises a glass cover plate or a silicon cover plate.

12. A method for forming a chip package, comprising:
    providing a first substrate having a first surface and a second surface opposite thereto, wherein the first substrate has a micro-electric element and a plurality of conducting pads adjacent to the first surface;
    disposing a second substrate on the first surface;
    forming an encapsulation layer on the first surface to cover the second substrate;

forming a plurality of openings in the first substrate to respectively expose a portion of each of the plurality of conducting pads; and forming a redistribution layer on the second surface, wherein the redistribution layer extends into the plurality of openings to electrically connect the plurality of conducting pads.

13. The method as claimed in claim 12, further comprising: forming a metal layer on the second substrate; and
forming a wire to electrically connect the metal layer to one of the plurality of conducting pads.

14. The method as claimed in claim 12, wherein the plurality of openings further extends to penetrate the plurality of conducting pads.

15. The method as claimed in claim 12, wherein the plurality of openings is formed by a laser drilling process.

16. The method as claimed in claim 14, wherein the plurality of openings further extends into the encapsulation layer.

17. The method as claimed in claim 14, further comprising: forming a metal layer on the second substrate; and
forming a wire to electrically connect the metal layer to one of the plurality of conducting pads.

18. The method as claimed in claim 12, wherein the plurality of openings respectively exposes a sidewall of each of the plurality of conducting pads.

19. The method as claimed in claim 18, wherein the redistribution layer further extends into the encapsulation layer.

20. The method as claimed in claim 18, further comprising: forming a metal layer on the second substrate; and
forming a wire to electrically connect the metal layer to one of the plurality of conducting pads.

21. The method as claimed in claim 12, wherein the microelectric element comprises a CMOS element or a MEMS element.

22. The method as claimed in claim 12, wherein the second substrate has a CMOS element or a MEMS element.

23. The method as claimed in claim 12, wherein the second substrate comprises a glass cover plate or a silicon cover plate.

\* \* \* \* \*